(12) United States Patent
Katoh et al.

(10) Patent No.: US 6,717,177 B2
(45) Date of Patent: Apr. 6, 2004

(54) SEMICONDUCTOR POWER CONVERSION APPARATUS

(75) Inventors: Shuji Katoh, Hitachiota (JP); Shigeta Ueda, Hitachi (JP); Hiromitsu Sakai, Tokai (JP); Takashi Ikimi, Hitachi (JP); Tomomichi Ito, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/400,479

(22) Filed: Mar. 28, 2003

(65) Prior Publication Data

US 2003/0201516 A1 Oct. 30, 2003

Related U.S. Application Data

(62) Division of application No. 10/095,102, filed on Mar. 12, 2002.

(30) Foreign Application Priority Data

Aug. 29, 2001 (JP) ........................................ 2001-259120

(51) Int. Cl.[7] ........................ H01L 29/40; H02H 7/122; H03K 17/60

(52) U.S. Cl. ........................ 257/47; 363/56.01; 327/478
(58) Field of Search ........................... 363/56.01, 56.05; 327/478, 318–323; 257/47, 197, 273, 355, 370, 378, 477, 517, 526, 539

(56) References Cited

U.S. PATENT DOCUMENTS

| | | | | | |
|---|---|---|---|---|---|
| 6,169,672 | B1 | * | 1/2001 | Kimura et al. | 363/56.05 |
| 6,204,717 | B1 | * | 3/2001 | Nagasu et al. | 327/318 |
| 6,304,472 | B1 | * | 10/2001 | Nagasu et al. | 363/97 |
| 6,407,937 | B2 | * | 6/2002 | Bruckmann et al. | 363/56.05 |
| 6,414,370 | B1 | * | 7/2002 | Nagasu et al. | 257/575 |
| 6,462,382 | B2 | * | 10/2002 | Yoshida et al. | 257/355 |

* cited by examiner

*Primary Examiner*—David Nelms
*Assistant Examiner*—Long Tran
(74) *Attorney, Agent, or Firm*—McDermott, Will & Emery

(57) ABSTRACT

A power conversion apparatus has a circuit configuration in which a collector voltage of an IGBT is divided. It also has a unit which protects the IGBT against overvoltages applied to the collector by outputting a potential of a voltage dividing point to a gate of the IGBT. A case of a resistor on the high-voltage side of the voltage dividing point is fixed to an emitter potential of the IGBT.

12 Claims, 8 Drawing Sheets

SEMICONDUCTOR POWER CONVERSION APPARATUS

This application is a divisional of application Ser. No. 10/095,102 filed Mar. 12, 2002.

BACKGROUND OF THE INVENTION

The present invention relates to a semiconductor power conversion apparatus using a semiconductor device, and more particularly to a semiconductor power conversion apparatus that suppresses overvoltages caused by switching operations.

Figure 2:
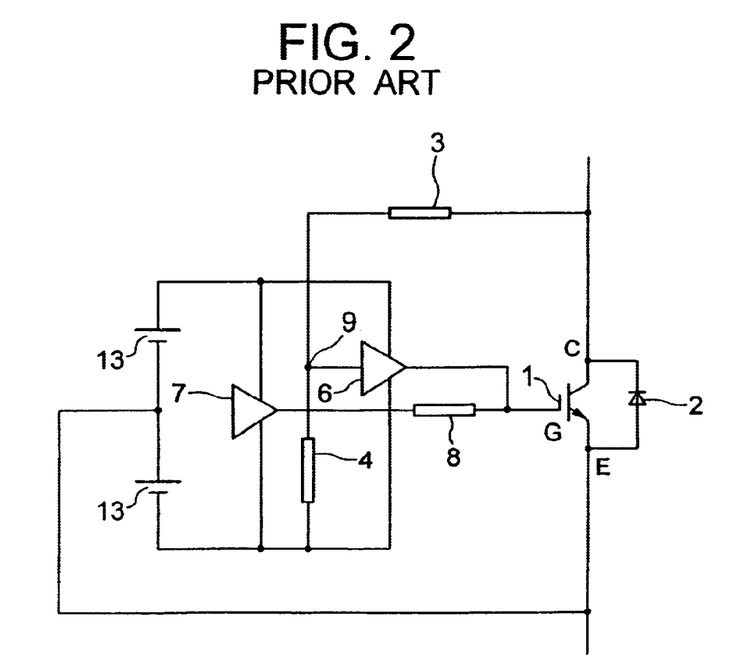
FIG. 2 shows an essential part of one arm of a conventional power converter.

When an IGBT (Insulated Gate Bipolar Transistor) is used in a power conversion apparatus, energy stored in wires is applied as surge voltages to the IGBT during its turn-off. A method of preventing a destruction of the IGBT due to overvoltages such as surge voltages during the turn-off is disclosed, for example, in "Series Connection of Snubberless IGBTs", Proceedings of 2000 IEE Japan, Industrial Application Conference, FIG. 1. This conventional technique discloses an active gate control method which divides a collector voltage by resistors and, based on the potential at the dividing point, determines a gate voltage command value to suppress overvoltages.

This conventional technique, as shown in FIG. 2, connects a gate of IGBT 1 to a voltage dividing point through a buffer circuit so that the gate voltage of the IGBT 1 is set to a voltage at the voltage dividing point. When an on-off pulse generator 7 outputs a negative potential while the IGBT 1 is in "ON" state, an electric charge accumulated at the gate of the IGBT is drawn out through a gate resistor 8, lowering the gate voltage, causing the IGBT to shift to the turn-off state and the collector voltage to rise. Even in a situation where the IGBT is applied surge voltages from the energy accumulated in leakage inductance of main wires, the conventional technique can cause a gate-emitter voltage (gate voltage) to rise, following an increase in the dividing point voltage resulting from an increase in the collector voltage. This in turn decreases the impedance of the IGBT 1 and thus clamps the collector voltage, protecting the device from an overvoltage destruction.

In the conventional technique described above, when the collector voltage of the IGBT 1 is divided by resistors, it is preferred that the voltage dividing resistors pass a larger current than the leakage current of the device and have a reduced loss. Hence, normally a resistor on the higher voltage side of the dividing point preferably has a resistance of 5–100 k$\Omega$, and a resistor on the lower voltage side is set at or less than 1/20 the resistance of the higher voltage side resistor (gate dielectric strength/collector dielectric strength). The resistor on the higher voltage side, since it is applied a high voltage between its terminals and has a large thermal loss, uses a construction of a wire wound resistor as shown in FIG. 4 or a resistor having conductive particles 33 dispersed in an inorganic substance 34 as shown in FIG. 5.

Figure 4:
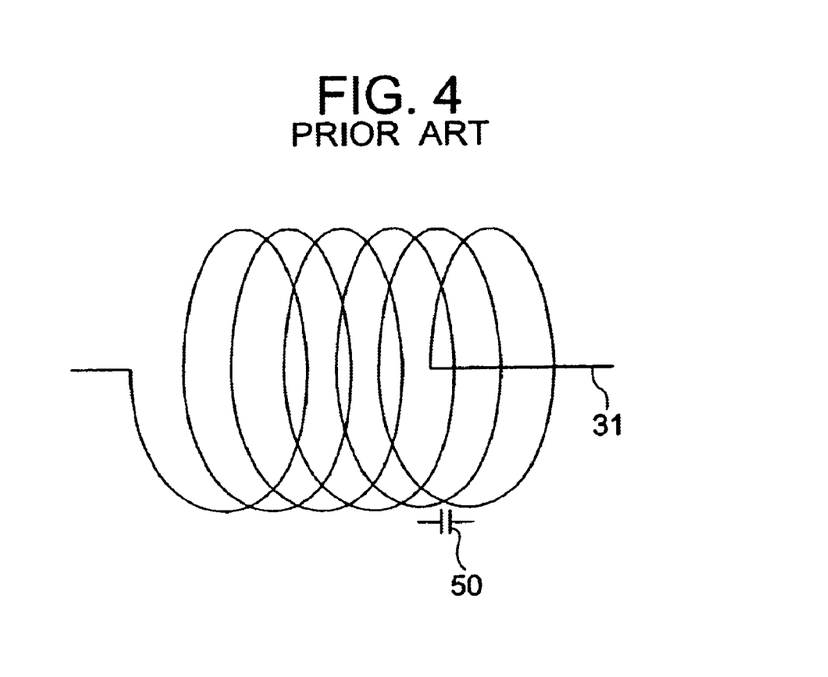
FIG. 4 is an explanatory view showing a problem with a prior art.
Figure 5:
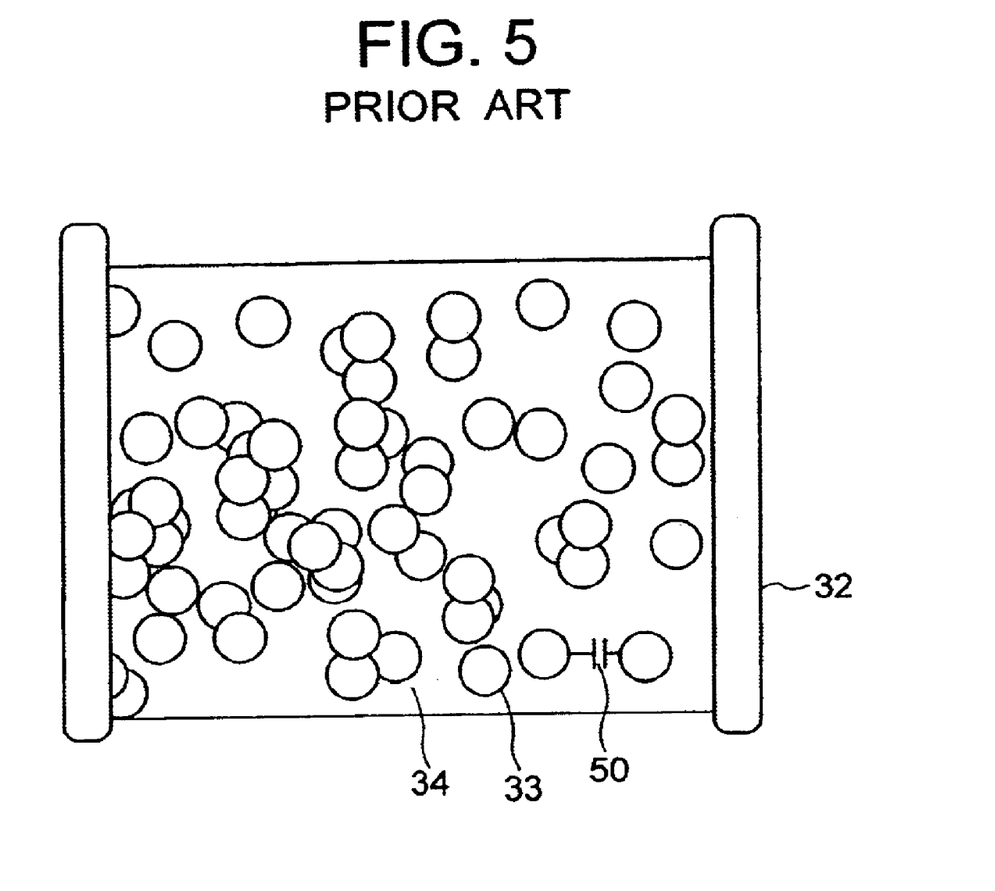
FIG. 5 is an explanatory view showing a problem with a prior art.

The main conductive paths of the wire wound resistor shown in FIG. 4 and of the resistor shown in FIG. 5 with conductive particles scattered in an inorganic substance have parasitic capacitances. The wire wound resistor has a wire 31 with a large resistivity wound to produce a large resistance, but there is a stray capacitance (stray capacitance present in the main conductive path) 50 between its windings. When the resistance is high, the impedance due to an inductance component can be ignored. In the resistor shown in FIG. 5 having conductive particles 33 dispersed in an organic substance 34, too, there is a stray capacitance 50 in the main conductive path. Reference numeral 32 represents electrode terminals of the resistor.

Figure 6:
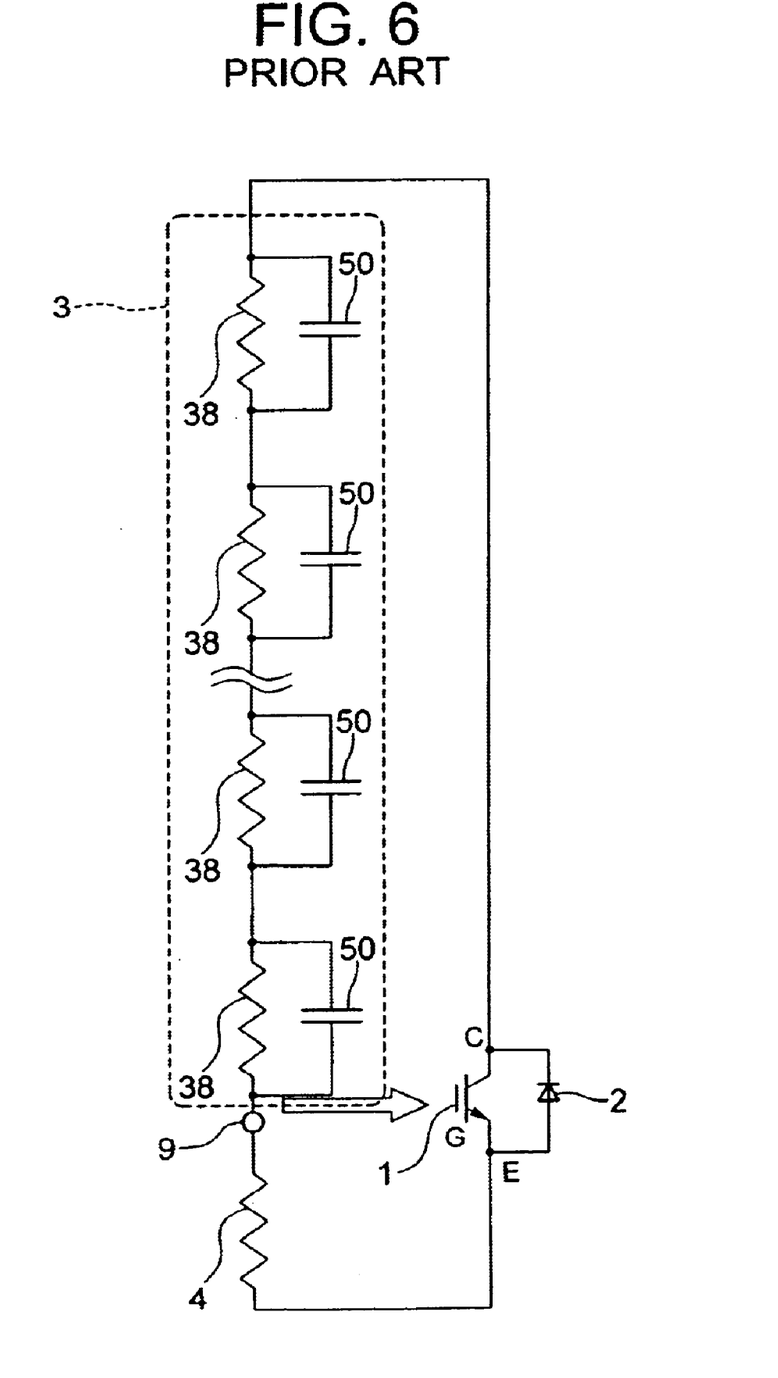
FIG. 6 is an explanatory view showing a problem with a prior art.

Since the high-resistance resistor 3 on the higher voltage side has a stray capacitance between its terminals as described above, if the collector voltage is divided by a resistor 3 and a resistor 4 as shown in FIG. 2, this practically divides the collector voltage of the IGBT 1 by an equivalent circuit comprising the resistor 4 and a series-parallel circuit of resistors 38 and capacitors 50, as shown in FIG. 6. Thus, if a voltage rising rate (dv/dt) of the collector voltage of the IGBT 1 is large when the IGBT 1 is turned off, the impedance of the high-resistance voltage dividing resistor 3 on the higher voltage side decreases, raising the dividing point voltage and increasing the IGBT gate voltage more than necessary, which in turn lowers the IGBT impedance excessively and increases the turn-off loss.

SUMMARY OF THE INVENTION

It is therefore an object of the present invention to provide a semiconductor power conversion apparatus which suppresses a steep rise of the IGBT collector voltage to protect the IGBT against overvoltages, and which has means for preventing the collector voltage from being clamped excessively when the voltage rising rate (dv/dt) of the collector voltage becomes large and thereby preventing an increase in the turn-off loss.

To solve the problems described above requires fixing the case of the high-voltage side resistor to the emitter potential of the IGBT. That is, in one aspect, the present invention provides the semiconductor power conversion apparatus which comprises: a circuit for diving a collector voltage of an IGBT; and means for controlling a gate potential of the IGBT to a potential of a voltage dividing point in the collector voltage dividing circuit to protect the IGBT against an overvoltage applied to a collector of the IGBT; wherein a voltage of a case of a resistor on a high-voltage side of the voltage dividing point is fixed to an emitter potential of the IGBT, and a plurality of the IGBTs connected in series are switched simultaneously.

In another aspect, the present invention provides a semiconductor power conversion apparatus wherein the IGBT collector voltage dividing circuit has a high-voltage side resistor and a low-voltage side resistor, and wherein a sum of terminal-to-terminal resistances of the high-voltage side resistor and the low-voltage side resistor divided by the resistance of the low-voltage side resistor is equal to an impedance produced by a stray capacitance between the terminals of the high-voltage side resistor divided by an impedance produced by a stray capacitance between a high-voltage side terminal of the high-voltage side resistor and the case of the high-voltage side resistor.

As described earlier, in wire wound resistors such as those shown in FIG. 4 and in resistors having conductive particles scattered in an inorganic material as shown in FIG. 5, there are also stray capacitances between a main conductive path in the resistor and a case of the resistor. By fixing the case of the high-voltage side resistor as a conductor to the emitter potential of the IGBT, a current, which flows through the stray capacitance present in the main conductive circuit to the low-voltage side resistor, can be bypassed to the emitter of the IGBT through the stray capacitance present between the main conductive path and the resistor case. Hence, even when the voltage rising rate (dv/dt) of the IGBT collector voltage is large, it is possible to suppress an excessive rise of the potential of the voltage dividing point between the high- and low-voltage side resistors.

Figure 7:
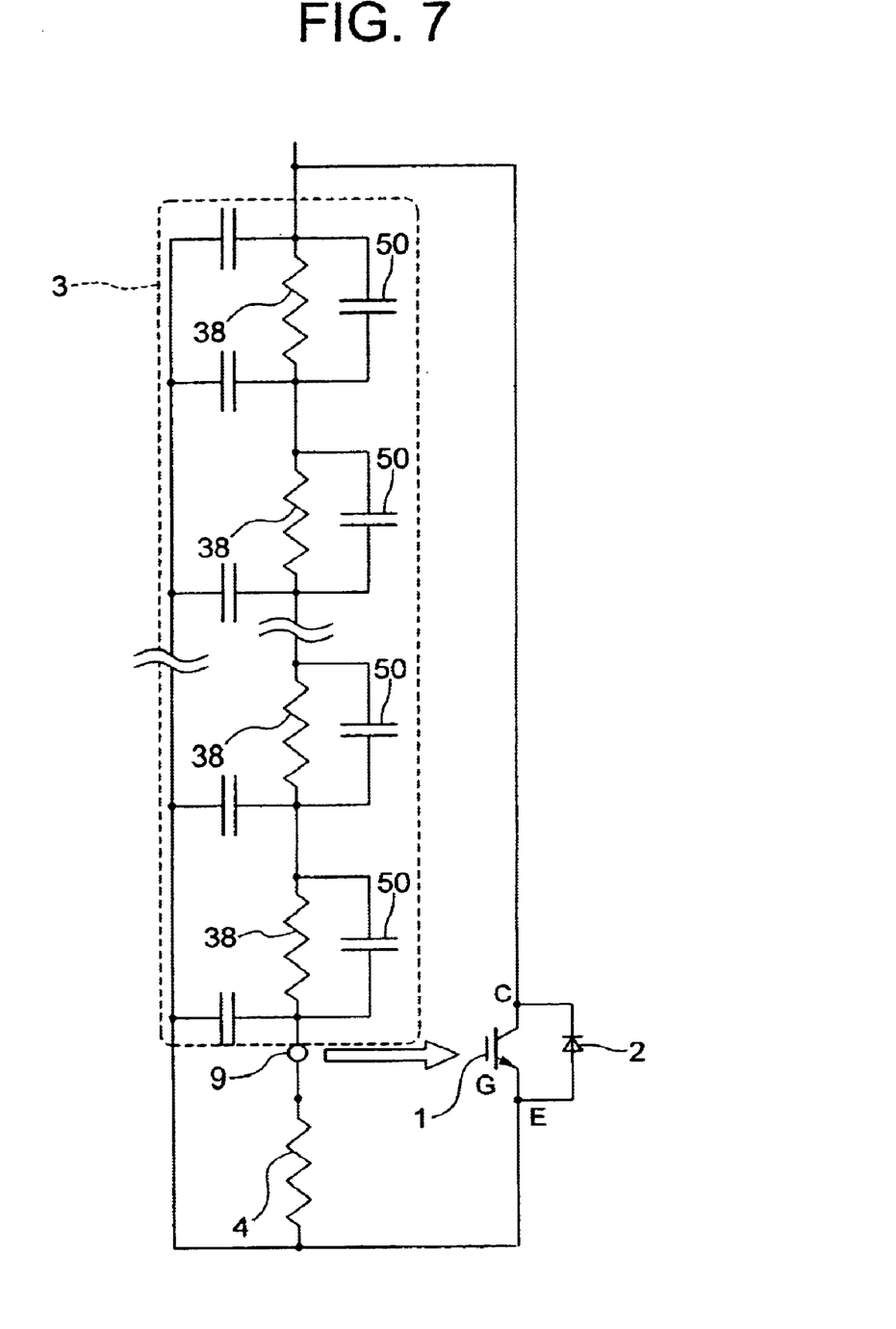
FIG. 7 is an explanatory view of the present invention.

When the case of the high-voltage side resistor is fixed to the emitter potential of the IGBT, the IGBT and the resistors for dividing the IGBT collector voltage can be represented by an equivalent circuit shown in FIG. 7. Hence, if a ratio between the terminal-to-terminal impedance of the resistor and the impedance between the high-voltage side terminal of the resistor and the emitter is set equal to a ratio between the resistance component of the high-voltage side resistor and the resistance of the low-voltage side resistor, the collector voltage can be divided more accurately.

Other objects, features and advantages of the invention will become apparent from the following description of the embodiments of the invention taken in conjunction with the accompanying drawings.

DESCRIPTION OF THE EMBODIMENTS

Now, embodiments of the present invention will be described by referring to the accompanying drawings. In the drawings explaining embodiments, parts having identical functions are assigned like reference numerals. The potential takes an emitter as a reference. Under conditions where an overvoltage is impressed between a collector and an emitter of an IGBT, the collector-emitter voltage and the collector-gate voltage are almost equal, and thus both of these voltages are hereinafter called collector voltages. Although in the following embodiments an IGBT is taken as an example, it may be replaced with a MOS (Metal-Oxide-Semiconductor) gate device.

(Embodiment 1)

Figure 1:
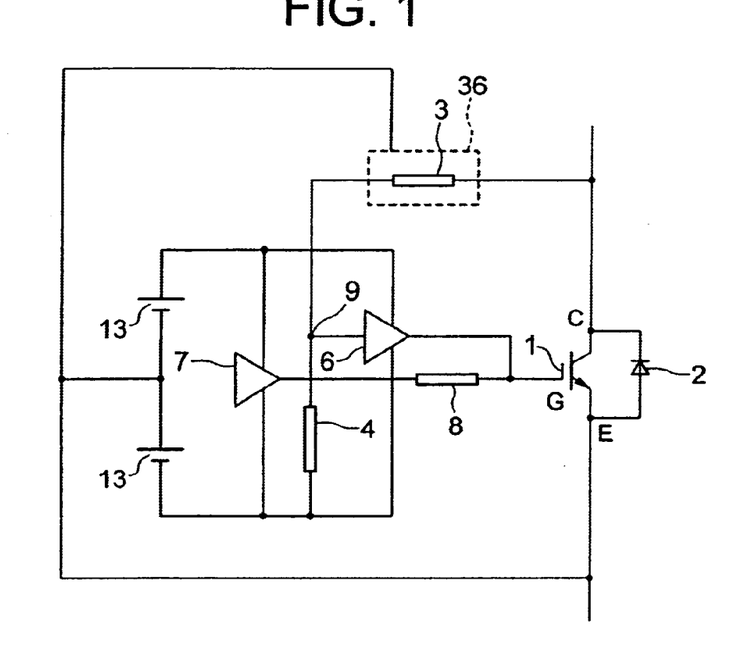
FIG. 1 shows an essential part of one arm of a power converter as a first embodiment of the present invention.
Figure 3:
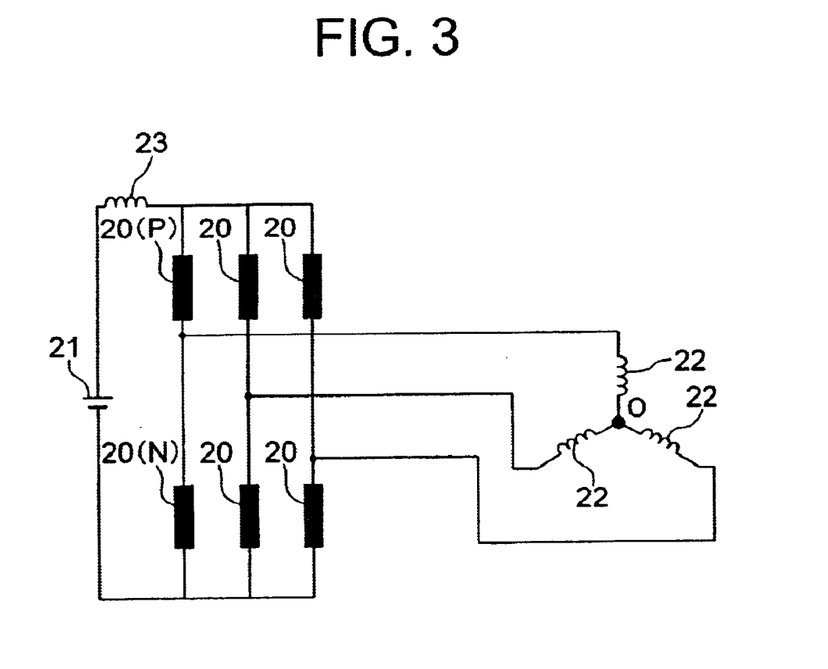
FIG. 3 shows an essential part of a power converter applying the present invention.

The construction of a power conversion apparatus according to this embodiment will be described with reference to FIGS. 1 and 3. FIG. 3 shows an essential part of the power conversion apparatus applying the present invention, and FIG. 1 shows an essential part of an arm 20 shown in FIG. 3. The power conversion apparatus has three parallel pairs of series-connected arms 20, each connected to a DC voltage source 21. A neutral point of each pair of arms is connected to a load 22.

The arm has the following construction. An IGBT 1 is connected antiparallelly with a fly wheel diode 2. A gate of the IGBT 1 is connected through a gate resistor 8 with an on-off pulse generator 7 that generates an on-off signal for switching instruction. Power is supplied to the pulse generator 7 by a power supply 13. Connected between a collector terminal of the IGBT and a wire 13N in a gate driver are a high-voltage side voltage dividing resistor 3 and a low-voltage side voltage-dividing resistor 4. A case 36 of the high-voltage side resistor 3 is fixed to an emitter potential of the IGBT 1. A voltage dividing point 9 is connected through a buffer circuit 6 to the gate of the IGBT 1.

Now, the operation of the power converter according to this embodiment will be explained. A power necessary to operate the pulse generator 7 is supplied from the power supply 13 to generates a PWM- or PAM-controlled drive signal by the to the pulse generator 7. Normally, a PWM- or PAM-controlled pulse signal is transmitted from another upper-level circuit to the pulse generator 7 to generate a PWM- or PAM-controlled drive signal based on the transmitted signal. The drive signal thus generated is input to the gate of the IGBT through the gate resistor 8 to turn on or off the IGBT 1. Thereby, the arm 20 is turn on or off to produce an AC voltage which is then applied to a load 22. Paired arms (e.g., an arm 20(P) and an arm 20(N)) are not turned on simultaneously.

The arm 20(N) and the arm 20(P) are alternately turned on or off. Let us consider a state in which a drive signal to the arm 20(P) is in "ON" state and a drive signal to the arm 20(N) is in "OFF" state. When the arm 20(P) is in "ON" state, current flows from a DC voltage source 21 to the arm 20(P) and then to the inductive load 22. When the arm 20(P) is turned off, a voltage that is produced in a wire inductance 23 present in a path of the main circuit (from the DC voltage source 21 to the arm 20(P) to the arm 20(N) to the DC voltage source 21) is superimposed on the voltage of the DC voltage source 21. This combined voltage is applied to the arm 20(P). Hence, the collector-emitter voltage of the IGBT 1 that forms the arm 20(P) also shoots up.

Figure 8:
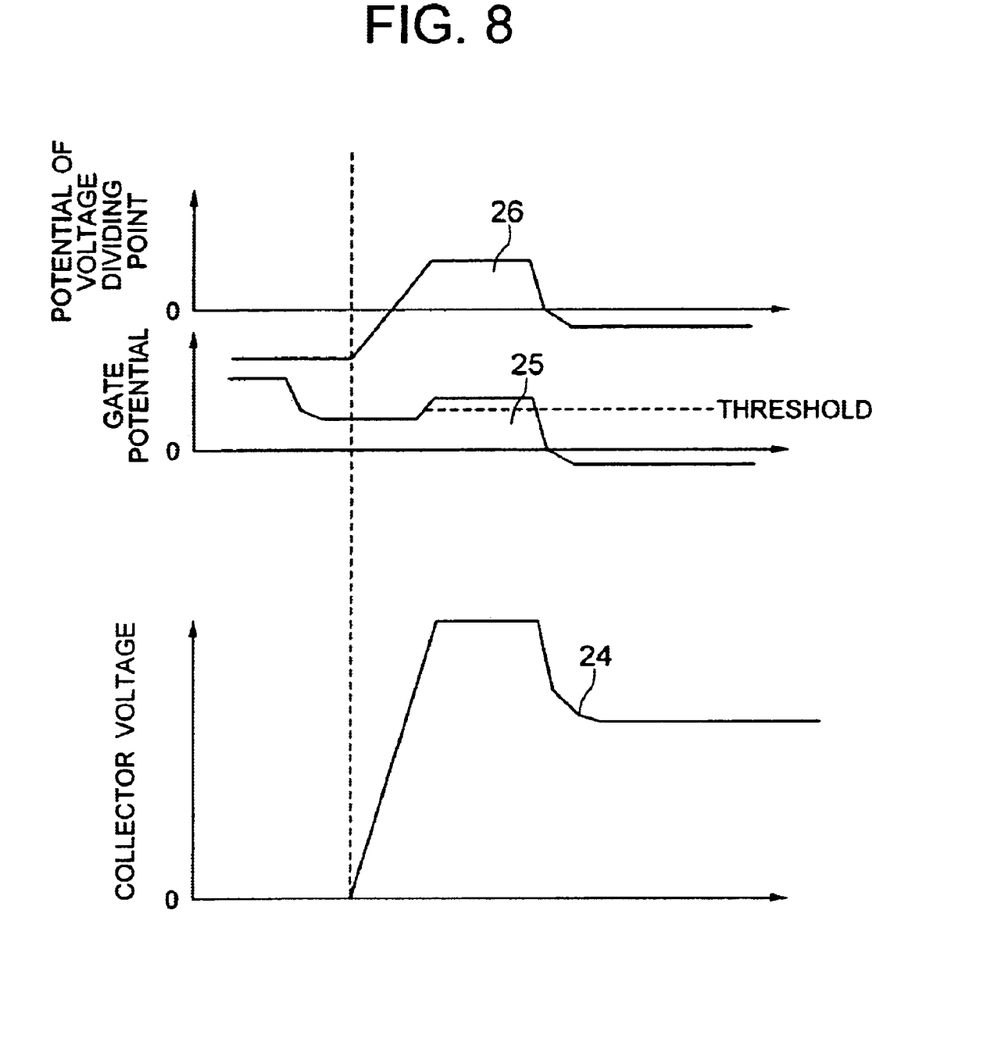
FIG. 8 is an explanatory view of the first embodiment of the present invention.

Collector voltage and gate voltage waveforms of the IGBT at time of turn-off will be described in more detail by referring to FIG. 8. When, with the IGBT turned on, the pulse generator 7 generates an off-signal, i.e., outputs a negative potential, a charge accumulated in the gate of the IGBT 1 is drawn through the gate resistor 8, causing the IGBT 1 to turn off, resulting in an increase in the collector potential 24. At the same time, the potential 26 at the voltage dividing point 9 also increases with the collector voltage.

At this time, if a relation as defined by an equation (1) holds, the voltage dividing ratio at the voltage dividing point can be kept constant regardless of dv/dt of the collector voltage.

$$\frac{Rh + R1}{R1} = \frac{Xh2}{Xh1} \quad (1)$$

In the equation (1), Rh indicates a resistance between the terminals of the high-voltage side resistor 3 measured by using a DC voltage source. Xh1 indicates an impedance between the terminals of the high-voltage side resistor 3 measured at such a particular frequency as will make the terminal-to-terminal impedance of the high-voltage side resistor 3 well below Rh (terminal-to-terminal impedance of the high-voltage side resistor 3 produced by stray capacitance 50 and stray capacitance 51). Xh2 indicates an impedance between the low-voltage side terminal of the high-voltage side resistor 3 and the case 36 measured at such a particular frequency as will make the terminal-to-terminal impedance of the high-voltage side resistor 3 well below Rh (impedance between collector and emitter of the IGBT produced by stray capacitance 50 and stray capacitance 51). R1 indicates a resistance of the low-voltage side resistor 4.

The gate potential of the IGBT 1 is controlled at a voltage of the voltage dividing point 9 by the buffer 6. Hence, when the collector voltage is subjected to an overvoltage (i.e., a voltage, which is generated in the wire inductance 23, superimposed on the voltage of the DC voltage source 21) and a gate potential 25 exceeds a threshold, the impedance of the IGBT 1 decreases to clamp the collector voltage 24. Since the potential of the voltage dividing point 9 increases in proportion to the collector voltage of the IGBT irrespective of the voltage rising rate (dv/dt) of the collector voltage, it is possible to prevent the collector voltage from being clamped excessively and increasing the turn-off loss.

Even in a range slightly outside the relationship of equation (1), connecting the case 36 of the resistor to the emitter potential can put the potential of the voltage dividing point closer to the intended resistor-divided potential than when the potential of the resistor case 36 is floated. Therefore, by holding the case 36 of the resistor 3 at the emitter potential, the excess clamping of the collector voltage can be prevented, which in turn reduces the loss at time of turn-off. As described above, this embodiment can reduce the turn-off loss.

(Embodiment 2)

Figure 9:
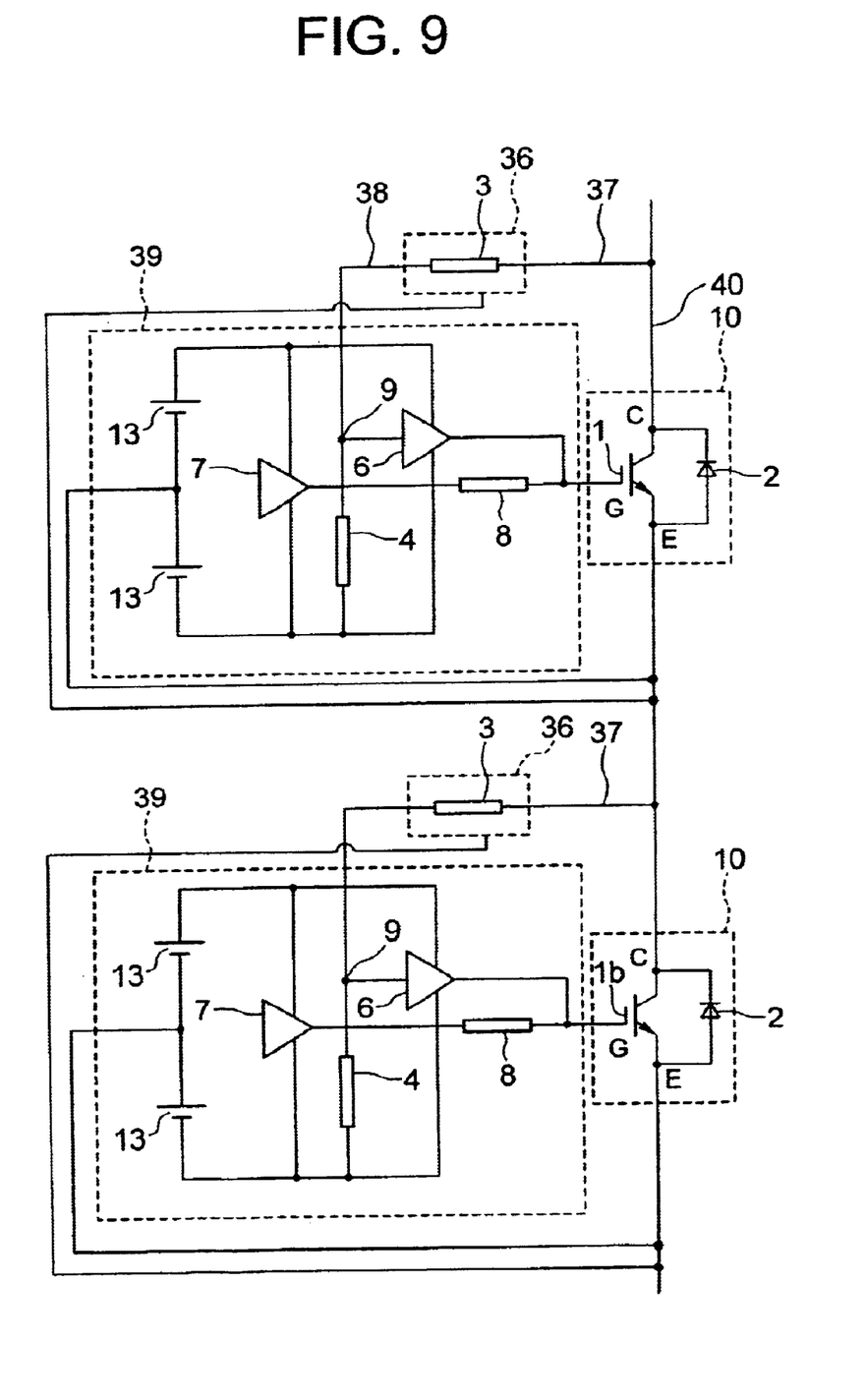
FIG. 9 shows an essential part of one arm of a power converter as a second embodiment of the present invention.

FIG. 9 shows an arm in this embodiment. Unlike the embodiment 1 which has one series-connected IGBT, this embodiment has two or more IGBTs connected in series. In FIG. 9 two IGBTs (IGBT 1 and IGBT 1b) are connected in series. The cases 3 of the resistors 3 are fixed to the emitter potentials of the IGBTs 1 and 1b, respectively.

When devices with different device characteristics such as different gate capacitances are connected in series, the collector voltage of an device with a smaller gate capacitance rises at an earlier timing during the turn-off than other devices. The early timing of the turn-off results in a faster rate of rise of impedance than other devices, and thus the device in question has a greater share of the DC voltage. Thus, the collector voltage rises more steeply than during the turn-off of one series-connected device. With the circuit in this embodiment, however, it is possible to clamp the collector voltage to equalize the voltage sharing among the series-connected IGBTs 1. Further, in this embodiment, by connecting the cases 36 of the resistors 3 to the emitter potentials of the associated IGBTs 1, an excessive clamping of the collector voltages can be prevented, thus relatively minimizing the turn-off loss. Further, the similar effect can be obtained if the IGBTs 1 are replaced with semiconductor devices such as power MOSFETs, that control their on-off switching operations by applying voltages to the MOS gates.

Figure 10:
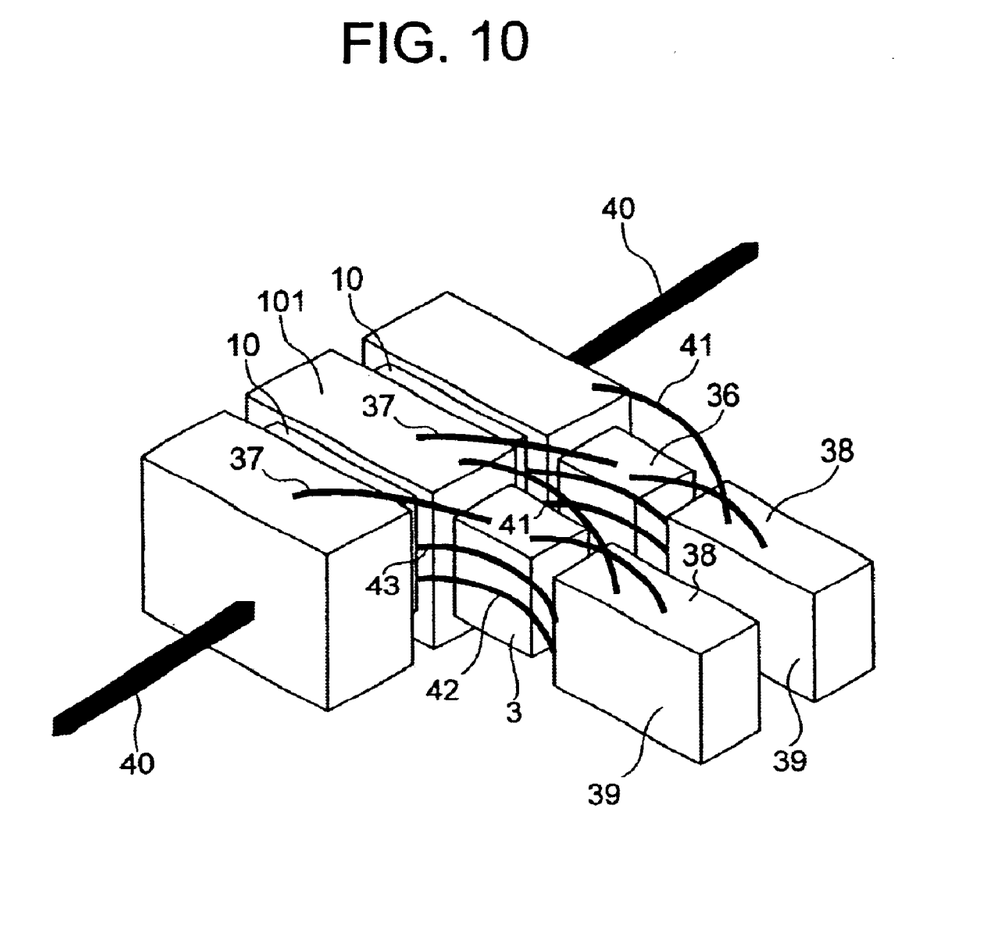
FIG. 10 is a schematic diagram showing a power converter equipped with the IGBT according to a second embodiment of the present invention.

FIG. 10 is a schematic diagram showing the IGBTs 1 in the circuit shown in FIG. 9. Packages 10 each incorporating an IBGT 1 and a diode 2 are clamped between cooling fins 101. The packages 10 have electrodes on both sides, one for a collector terminal electrode and one for an emitter terminal electrode, in contact with the cooling fins 101. The collector terminal is on the side of a main wire 40(b). The cases 36 of the high-voltage side resistors are mounted in contact with the cooling fins 101 to hold the cases 36 at the potentials of the emitter terminals of the IGBTs 1. The cooling fins 101 at the collector potentials of the IGBTs 1 and the high-voltage side voltage dividing resistors 3 are electrically connected by wires 37. The other terminals of the resistors 3 are electrically connected to the low-voltage side voltage dividing resistors 4 in the gate drivers by wires 38. The gate resistors 8 in the gate drivers and the gates of the IGBTs 1 are connected by gate wires 42. The neutral point of the series-connected voltage source 13 and the emitters of the IGBTs 1 are connected by wires 43. It is preferable that the cases 39 of the gate drivers are electrically connected to the emitter potentials.

In FIG. 10, the cases 39 of the gate drivers are electrically connected to the cooling fins 101 at the emitter potentials of the IGBTs 1 by wires 41. In this embodiment, because the resistors 3 are mounted to the cooling fins, the temperature rises of the resistors 3 can also be suppressed.

In the semiconductor power conversion apparatus according to the present invention, since the voltage of the voltage dividing point 9 increases in proportion to the collector voltage of the IGBT regardless of the voltage rising rate (dv/dt) of the collector voltage, the collector voltage can be prevented from being clamped excessively, which in turn prevents an increase in the turn-off loss.

It should be further understood by those skilled in the art that the foregoing description has been made on embodiments of the invention and that various changes and modifications may be made in the invention without departing from the spirit of the invention and the scope of the appended claims.

What is claimed is:

1. An insulated gate bipolar transistor (IGBT) overvoltage protection apparatus comprising:

a circuit for dividing a collector voltage of an insulated gate bipolar transistor (IGBT); and means for controlling a potential on a gate of said IGBT to be a potential on a voltage dividing point divided by said circuit, so as to protect said IGBT from an overvoltage applied to a collector of said IGBT, wherein a potential on a casing housing a high-voltage resistor having a voltage higher than that of the voltage dividing point is fixed to be an emitter potential of said IGBT.

2. An insulated gate bipolar transistor (IGBT) overvoltage protection apparatus according to claim 1, wherein:

said circuit for dividing the said collector voltage of said IGBT includes a high-voltage resistor having a voltage higher than that of said voltage dividing point and a low-voltage resistor having a voltage lower than that of said voltage dividing point; and a value which is obtained by dividing a sum of a terminal-to-terminal resistance of said high-voltage resistor and a resistor of said low-voltage resistor by the resistance of said low-voltage resistor is made equal to a value which is obtained by dividing an impedance produced by a stray capacitance between terminals of said high-voltage resistor by an impedance produced by a stray capacitance between a high-voltage terminal of said high-voltage resistor and said casing.

3. An insulated bipolar transistor (IGBT) overvoltage protection apparatus according to claim 2, wherein said IGBT is replaced with a metal-oxide-semiconductor (MOS) gate device.

4. An insulated gate bipolar transistor (IGBT) overvoltage protection apparatus according to claim 2, wherein the casing housing said high-voltage resistor is mounted on a cooling fin held to be the emitter potential of said IGBT.

5. An insulated gate bipolar transistor (IGBT) overvoltage protection apparatus according to claim 4, wherein said IGBT is replaced with a metal-oxide-semiconductor (MOS) gate device.

6. An insulated gate bipolar transistor (IGBT) overvoltage protection apparatus according to claim 1, wherein the casing housing said high-voltage resistor is mounted on a cooling fin held to be the emitter potential of said IGBT.

7. An insulated gate bipolar transistor (IGBT) overvoltage protection apparatus according to claim 6, wherein said IGBT is replaced with a metal-oxide-semiconductor (MOS) gate device.

8. An insulated gate bipolar transistor (IGBT) overvoltage protection apparatus according to claim 1, wherein said IGBT is replaced with a metal-oxide-semiconductor (MOS) gate device.

9. An overvoltage protection apparatus comprising:

a circuit for dividing a collector voltage of a metal-oxide-semiconductor (MOS) gate device; and means for controlling a potential on a gate of said MOS gate device to be a potential on a voltage dividing point divided by said circuit, so as to protect said MOS gage device from an overvoltage applied to a collector of said MOS gage device, wherein a potential on a casing housing a high-voltage resistor having a voltage higher than that of said voltage dividing point is fixed to be an emitter potential of said MOS gage device.

10. An overvoltage protection apparatus according to claim 9, wherein:

said circuit for dividing the collector voltage of said MOS gage device includes a high-voltage resistor having a voltage higher than that of said voltage dividing point, and a low-voltage resistor having a voltage lower than that of said voltage dividing point, and a value which is obtained by dividing a sum of a terminal-to-terminal resistance of said high-voltage resistor and a resistance of said low-voltage resistor by the resistance of said low-voltage resistor is made equal to a value which is obtained by dividing an impedance produced by a stray capacitance between terminals of said high-voltage resistor by an impedance produced by a stray capacitance between a high-voltage terminal of said high-voltage resistor and said casing.

11. An overvoltage protection apparatus according to claim 10, wherein the casing housing said high-voltage resistor is mounted on a cooling fin held to be the emitter potential of said MOS gate device.

12. An overvoltage protection apparatus according to claim 9, wherein the casing housing said high-voltage resistor is mounted on a cooling fin held to be the emitter potential of said MOS gate device.

* * * * *